(12) United States Patent
Usui et al.

(10) Patent No.: US 7,301,228 B2
(45) Date of Patent: Nov. 27, 2007

(54) SEMICONDUCTOR DEVICE, METHOD FOR MANUFACTURING SAME AND THIN PLATE INTERCONNECT LINE MEMBER

(75) Inventors: Ryosuke Usui, Ichinomiya (JP); Hideki Mizuhara, Bisai (JP); Yusuke Igarashi, Isesaki (JP); Noriaki Kojima, Ogaki (JP); Noriaki Sakamoto, Gunma (JP)

(73) Assignees: Sanyo Electric Co., Ltd., Osaka (JP); Kanto Sanyo Semiconductors Co., Ltd., Gunma (JP)

( * ) Notice: Subject to any disclaimer, the term of this patent is extended or adjusted under 35 U.S.C. 154(b) by 0 days.

(21) Appl. No.: 10/725,993

(22) Filed: Dec. 3, 2003

(65) Prior Publication Data
US 2004/0140551 A1      Jul. 22, 2004

(30) Foreign Application Priority Data
Dec. 3, 2002     (JP)     ............................. 2002-351827

(51) Int. Cl.
*H01L 23/04*     (2006.01)
*H01R 9/09*     (2006.01)

(52) U.S. Cl. .................... 257/698; 257/702; 174/251; 174/260; 174/262; 428/209; 428/901

(58) Field of Classification Search ............... 428/209, 428/901; 174/250, 258, 251, 260, 262; 257/701–702, 698
See application file for complete search history.

(56) References Cited

U.S. PATENT DOCUMENTS

| | | | |
|---|---|---|---|
| 4,601,944 A * | 7/1986 | Zussman ................... 442/168 |
| 5,120,573 A * | 6/1992 | Miyazaki et al. ........... 438/652 |
| 5,468,999 A * | 11/1995 | Lin et al. ................... 257/784 |
| 5,726,527 A | 3/1998 | Gassler et al. |
| 5,773,882 A * | 6/1998 | Iwasaki ..................... 257/692 |
| 6,091,137 A * | 7/2000 | Fukuda ...................... 257/679 |
| 6,324,067 B1 * | 11/2001 | Nishiyama .................. 361/761 |
| 6,359,235 B1 * | 3/2002 | Hayashi ..................... 174/260 |
| 6,528,145 B1 * | 3/2003 | Berger et al. ............... 428/156 |
| 6,734,567 B2 * | 5/2004 | Chiu et al. .................. 257/778 |
| 6,764,748 B1 * | 7/2004 | Farquhar et al. ............ 428/209 |

FOREIGN PATENT DOCUMENTS

CN     1125218 A     6/1996

(Continued)

OTHER PUBLICATIONS

Chinese Office Action for Corresponding Patent Application No. 200310120768.4, Date of Dispatch: Mar. 31, 2006.

(Continued)

*Primary Examiner*—Cathy F. Lam
(74) *Attorney, Agent, or Firm*—McDermott Will & Emery LLP

(57) ABSTRACT

The present invention provides a low-profile and light-weight semiconductor device having improved product reliability and higher frequency performance. A multi-layer interconnect line structure is disposed just under circuit devices 410a and 410b. An Interlayer insulating film 405 that composes a part of the multi-layer interconnect line structure is formed of a material having a relative dielectric constant within a range from 1.0 to 3.7, and a dielectric loss tangent within a range from 0.0001 to 0.02.

9 Claims, 13 Drawing Sheets

FOREIGN PATENT DOCUMENTS

| | | |
|---|---|---|
| CN | 1279157 A | 1/2001 |
| JP | 4-250683 A | 9/1992 |
| JP | 8-153821 | 6/1996 |
| JP | 2000-269616 A | 9/2000 |
| JP | 2001-015929 | 1/2001 |
| JP | 3213291 | 7/2001 |
| JP | 2002-94247 A | 3/2002 |
| JP | 2002-110717 | 4/2002 |
| JP | 2002-134864 A | 5/2002 |

OTHER PUBLICATIONS

Japanese Office Action issued in corresponding Japanese Patent Application No. 2003-400047, dated Aug. 8, 2006.

* cited by examiner

PRIOR ART

FIRST LAYER

SECOND LAYER

FIRST LAYER + SECOND LAYER

SEMICONDUCTOR DEVICE, METHOD FOR MANUFACTURING SAME AND THIN PLATE INTERCONNECT LINE MEMBER

This application is based on Japanese patent application NO.2002-351827, the content of which is incorporated hereinto by reference.

BACKGROUND OF THE INVENTION

1. Field of the Invention

The present invention relates to a semiconductor device, which mounts semiconductor chips or the like thereon, and is coupled to interconnect line substrates or the like, and a method for manufacturing same, and also relates to a thin plate interconnect line member employed for the semiconductor device.

2. Description of the Related Art

Portable electronics products such as cellular phone, PDA, DVC, DSC or the like acquire multi-functions in an accelerating speed, and in such condition the miniaturization and the weight reduction is essential for these products to be accepted by the market, and thus LSI having higher integration level are necessary to satisfy these needs. On the other hand, more user-friendly and convenient products are also desired for these electronics products by the market, and thus LSI having multiple functions and higher performances are needed for utilizing these products. In this reason, number of I/O increases as the level of the integration of LSI increases, while the requirement for miniaturizing the package itself becomes considerable. In order to combine these two requirements into one product, developments of the semiconductor packaging, which is applicable for mounting the semiconductor devices at higher density of devices, is strongly demanded. To address these requirements, various developments in the packaging technology called "chip size packaging" or "chip scale packaging" (CSP) are actively conducted.

One of known examples of these packaging may be "ball grid array" (BGA). BGA is made by the method, in which semiconductor chips are mounted on a substrate for packaging, and after the substrate is molded with a resin, solder balls are formed on an opposite surface thereof at area array positioning for utilizing them as external terminals. BGA comprises a mounting area that is a plane shape, and thus it is possible to relatively-easily achieve the miniaturization of the package. Further, the circuit substrate of the BGA is not necessary to adopt to a narrow-pitch specification, and higher precision for the mounting technology is not required for BGA, and consequently total cost for mounting the devices thereon can be reduced by employing BGA, even if the cost of the package itself is rather higher.

FIG. 1 is a diagram of a BGA, showing a schematic structure of a general BGA. BGA 100 comprises a structure, in which a LSI chip 102 is mounted on a glass epoxy substrate 106 via an adhesive layer 108. The LSI chip 102 is molded with a sealant resin 110. The LSI chip 102 is electrically coupled to the glass epoxy substrate 106 via a metal line 104. Solder balls 112 are disposed at an array arrangement on the backside of the glass epoxy substrate 106. The BGA 100 is mounted on a printed board via the solder balls 112.

An example of other type of CSP is described in JP-A-2002-94,247. More specifically, JP-A-2002-94,247 discloses a system-in package having an LSI for high frequency on board. A multi-layer interconnect line structure is formed on a base substrate in this package, and circuit devices such as LSI for high frequency or the like are formed thereon. The multi-layer interconnect line structure comprises a structure, in which a core substrate, a copper leaf with a resin or the like forms a laminate structure.

However, it is still difficult to achieve the levels of miniaturization, the reduction of the thickness and the reduction of the weight of the package that are currently desired in the market of the portable electronics products or the like, by employing the conventional CSP. This is because the conventional CSP includes the substrate for supporting the chips. The existence of the support substrate increases the thickness of the entire package, and thus the miniaturization and the reduction of the thickness and the weight of the package is limited. Further, this also adversely limits the improvement on the heat dissipation ability thereof.

In view of these situations, the present invention provides a solution to the above-mentioned problems, and it is an object of the present invention to provide a low-profile and light-weight semiconductor device having improved product reliability and improved high frequency performance.

SUMMARY OF THE INVENTION

The present invention for solving the above-mentioned problems comprises following configurations.

According to the present invention, there is provided a semiconductor device comprising: an insulating resin layer; and a semiconductor chip mounted on the insulating layer; wherein the insulating resin layer includes a patterned interconnect line embedded therein, and wherein the insulating resin layer has a relative dielectric constant within a range from 1.0 to 3.7, and a dielectric loss tangent within a range from 0.0001 to 0.02.

Here, the semiconductor may be placed above the insulating layer, below the insulating layer, or besides the insulating layer. According to the present invention, there is provided a method for manufacturing a semiconductor device, comprising: providing a semiconductor device-forming region on a surface of a substrate; forming a layer structure in the semiconductor device-forming region on the substrate, the layer structure including an insulating resin layer and a patterned interconnect line being embedded in the insulating resin layer; mounting a semiconductor chip on the layer structure, respectively; molding the semiconductor chip with an insulating material in the semiconductor device-forming region; removing the substrate; exposing at least a part of the patterned interconnect line; and dicing the insulating resin outside the semiconductor device-forming region and separating thereof into a module-forming unit to form a semiconductor device, wherein a material of the insulating resin layer is a resin having a relative dielectric constant within a range from 1.0 to 3.7, and a dielectric loss tangent within a range from 0.0001 to 0.02.

A thin plate interconnect line member according to the present invention has a semiconductor chip-mounting surface and an interconnect line substrate-coupling surface, and comprises: an insulating resin layer; and a patterned interconnect line being embedded within the insulating resin layer, wherein at least a part of the patterned interconnect line is exposed on the interconnect line substrate-coupling surface, and wherein the insulating resin layer has a relative dielectric constant within a range from 1.0 to 3.7, and a dielectric loss tangent within a range from 0.0001 to 0.02.

The present invention employs a configuration of having a patterned interconnect line embedded within the insulating resin layer. Unlike the conventional CSP such as BGA or the like, the configuration according to the present invention does not include a support substrate for supporting the interconnect line, and therefore a package with lower-profile and having reduced weight is obtainable by employing the configuration, and further the circuit interconnect line having lower dielectric constant can be presented to provide improved properties for high-speed data transfer and/or high-frequency circuit. Further, the present invention employs a configuration, in which the semiconductor chip is mounted on the surface of the insulating resin layer, which has the patterned interconnect line embedded therein. This provides that heat generated by the semiconductor chip is efficiently transferred through the patterned interconnect line, and is eventually dissipated from the backside thereof in higher efficiency, thereby providing improved heat dissipation ability. Alternatively, the present invention may employ another configuration, in which at least a part of the patterned interconnect line is exposed on the backside surface of the insulating resin layer, and the heat dissipation ability can be further improved by having this configuration.

Further, the insulating resin layer disposed between the patterned interconnect lines has a relative dielectric constant within a range from 1.0 to 3.7, and a dielectric loss tangent within a range from 0.0001 to 0.02. This configuration provides a semiconductor device having improved high frequency performance in addition to having the above described various advantages obtainable due to the support substrate-free configuration. More specifically, the parasitic capacitance between the interconnect lines is reduced and the signal loss is considerably reduced.

Further, the manufacturing method according to the present invention provides a manufacturing of the semiconductor device, which has the above-described performances, with better process stability. Also, this manufacturing method comprises: forming a layer structure having patterned interconnect lines embedded therein; thereafter removing the base; and dicing the portion of the insulating resin layer outside the module-forming region, which is not molded with the insulating resin. This configuration reduces the roughening of the cut surface and/or the wear of the blade, which are caused by the cutoff of the base and/or mold resin.

The semiconductor device according to the present invention includes semiconductor chips such as LSI chip, and optionally other circuit devices, and is mounted on the printed circuit board or the like. These chips may be mounted thereon via wire bonding, or via flip-chip mounting. When the chips are flip-chip mounted thereon, the problem of the signal delay becomes considerable due to the increase of the parasitic capacitance between interconnect lines, and therefore the features of the present invention, which is capable of effectively solve the problem, can preferably be applicable thereto.

The exemplary relative dielectric constant and the dielectric loss tangent according to the present invention may be values obtainable within a frequency range from 1 MHz to 10 GHz for example, and more preferably values obtainable within a frequency range from 1 GHz to 10 GHz. Providing these values ensures improving the high frequency performance thereof.

The relative dielectric constant may preferably be not higher than 3.0. Having this range of the relative dielectric constant, the parasitic capacitance between the interconnect lines can be reduced to a level that does not cause a problem in the practical operation, when the size of the module is reduced. The dielectric loss tangent may preferably be not higher than 0.003. Having this range of the dielectric loss tangent, the signal loss can be further reduced.

The water absorption of the insulating resin layer according to the present invention may be equal to or less than 0.1%. Having this range of the water absorption, penetration of water from the backside of the insulating resin layer through this insulating resin layer into the semiconductor chip can be effectively inhibited. The semiconductor devices according to the present invention includes the configuration, in which the semiconductor chips are mounted on the surface of the insulating resin layer having the interconnect lines embedded therein, and therefore has improved heat dissipation ability. On the other hand, it is a critical technical issue to prevent the penetration of water to the semiconductor chips via the insulating resin layer. Since the above-mentioned configuration employs the insulating resin layer having the water absorption of equal to or less than 0.1%, such water penetration can effectively be prevented. More preferably, the water absorption may be equal to or less than 0.05%. Having this water absorption, moisture uptake of the semiconductor chips can be effectively inhibited in the process for manufacturing the modules, in particular in the high temperature processing such as solder processing. Here, the water absorption can be measured according to JIS-K 6911 (Japanese industrial standard).

The present invention may include the configuration, in which the patterned interconnect line having the multi-layer structure is embedded in the insulating resin layer. Having such multi-layer interconnect line structure provides the module having various functions in addition to comprising the mounted devices thereon. In general, when the multi-layer interconnect line structure is employed for the support substrate-free module such as the type of the module according to the present invention, maintaining the high frequency performance and the moisture-absorption characteristics at higher levels is considerably difficult to achieve. Nevertheless, the present invention provides a solution to such problem by comprising the insulating resin layer having specific performances.

The material of the insulating resin layer may preferably be a resin containing epoxy resin, BT (bismaleimide triazine) resin liquid crystal polymer or the like. Having the insulating resin layer of such resins, the semiconductor device having improved high frequency performance and the product reliability can be obtained.

The present invention may include the configuration, in which the surface roughness Ra of the patterned interconnect line is equal to or less than 1 μm. Having this range of the surface roughness, the influence due to the skin effect thereof is eliminated, and the module having improved high frequency performance can be presented. For example, when copper is employed for the material for the interconnect line, the skin depth at 1 GHz is about 2 μm. Thus, providing the surface roughness Ra of the patterned interconnect line of equal to or less than 1 μm effectively improves the high frequency performance.

The present invention may include the configuration, in which the semiconductor chips are sealed by the mold resin and a pseudo-line is provided on the surface of the insulating resin layer. Having this configuration, the adhesiveness between the insulating resin layer and the mold resin can be improved.

The method according to the present invention may include the configuration, in which the step of forming the layer structure including a patterned interconnect line being embedded in the insulating resin layer may comprises: forming the insulating resin layer over the base; providing a connecting hole in the insulating resin layer; forming a metal film to fill the connecting hole; and selectively etching the metal film to form the patterned interconnect line. Having this configuration, the insulating resin layer including the patterned interconnect line therein can preferably be formed.

The method according to the present invention may also include the configuration, in which the base is an electrical conductive base, and at least a part of the metal film is formed via an electrolytic plating method, in which the electrical conductive base is utilized as an electrode thereof. Having this configuration, the metal film can be formed to a desired thickness with improved process controllability.

Further, the method according to the present invention may also include the configuration, which further comprises conducting a surface processing after forming the metal layer to achieve a surface roughness of the metal layer of not higher than 1 µm. Having this configuration, the patterned interconnect lines having improved adhesiveness with the insulating resin layer can preferably be formed.

According to the present invention, there is provided a semiconductor device, comprising: an insulating resin layer; and a semiconductor chip mounted on said insulating layer; wherein said insulating resin layer includes a patterned interconnect line embedded therein, and wherein the coefficient of thermal expansion of said insulating resin layer is within a range from −5 to 5 ppm/degree centigrade.

By using a material having the coefficient of thermal expansion (ppm/degree centigrade) of the above range to manufacture a semiconductor device, influence of variety of heat hysteresises that are burden to the semiconductor device during the manufacturing process thereof can be reduced. Thus, displacement of alignment of layers composing the semiconductor device is reduced. As a result, the semiconductor device having improved high frequency performance can be obtained.

According to the present invention, there is provided a method for manufacturing a semiconductor device, comprising: providing a semiconductor device-forming region on a surface of a substrate; forming a layer structure in said semiconductor device-forming region on said substrate, said layer structure including an insulating resin layer and a patterned interconnect line being embedded in said insulating resin layer; mounting a semiconductor chip on said layer structure, respectively; molding said semiconductor chip with an insulating material in said semiconductor device-forming region☐ removing said substrate; exposing at least a part of said patterned interconnect line; and dicing said insulating resin outside said semiconductor device-forming region and separating thereof into a module-forming unit to form a semiconductor device, wherein the coefficient of thermal expansion of said insulating resin layer is within a range from −5 to 5 ppm/degree centigrade.

According to the present invention, there is provided a thin plate interconnect line member having a semiconductor chip-mounting surface and an interconnect line substrate-coupling surface opposite to said chip-mounting surface, comprising: an insulating resin layer; and a patterned interconnect line being embedded within said insulating resin layer, wherein at least a part of said patterned interconnect line is exposed on said interconnect line substrate-coupling surface, and wherein the coefficient of thermal expansion of said insulating resin layer is within a range from −5 to 5ppm/degree centigrade.

DESCRIPTION OF THE PREFERRED EMBODIMENTS

The present inventors have developed a new package called ISB (Integrated System in Board™). The ISB is a unique coreless system-in package, which is a package for electronics circuits such as mainly semiconductor bare chips or the like that includes no core (base) for supporting circuit parts while including a patterned copper interconnect line. An example of such system-in package is described in JP-A-2002-110,717.

Figure 1:
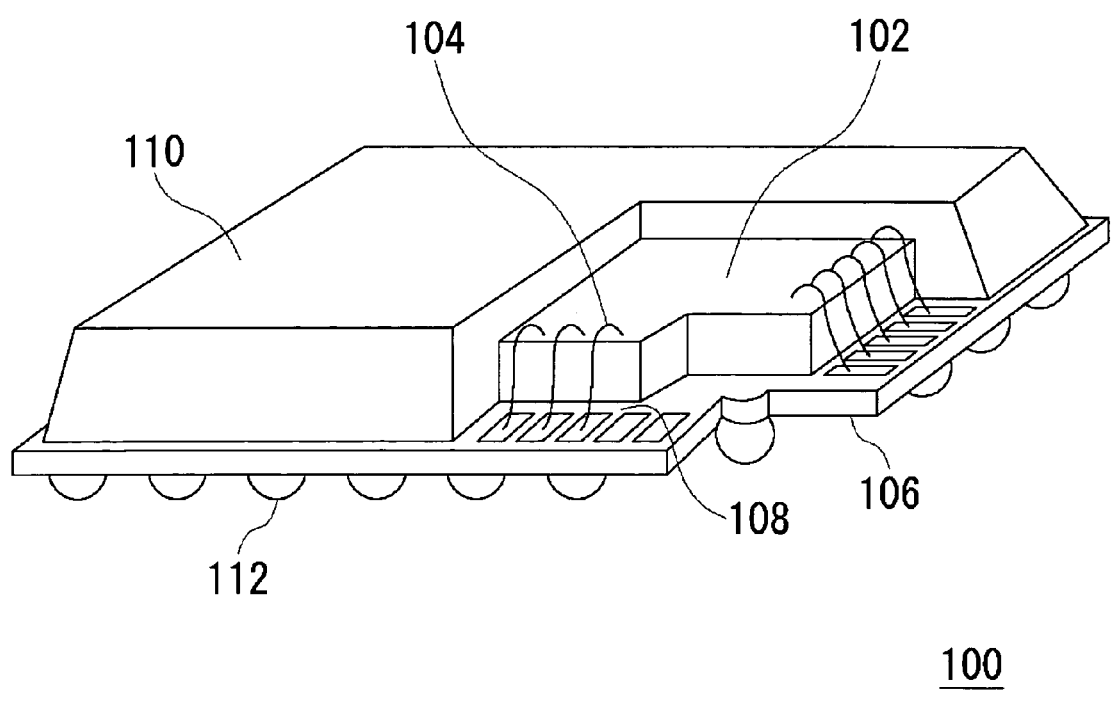
FIG. 1 is a partially exploded diagram of the BGA, for the use in describing the structure of the BGA.
Figure 2:
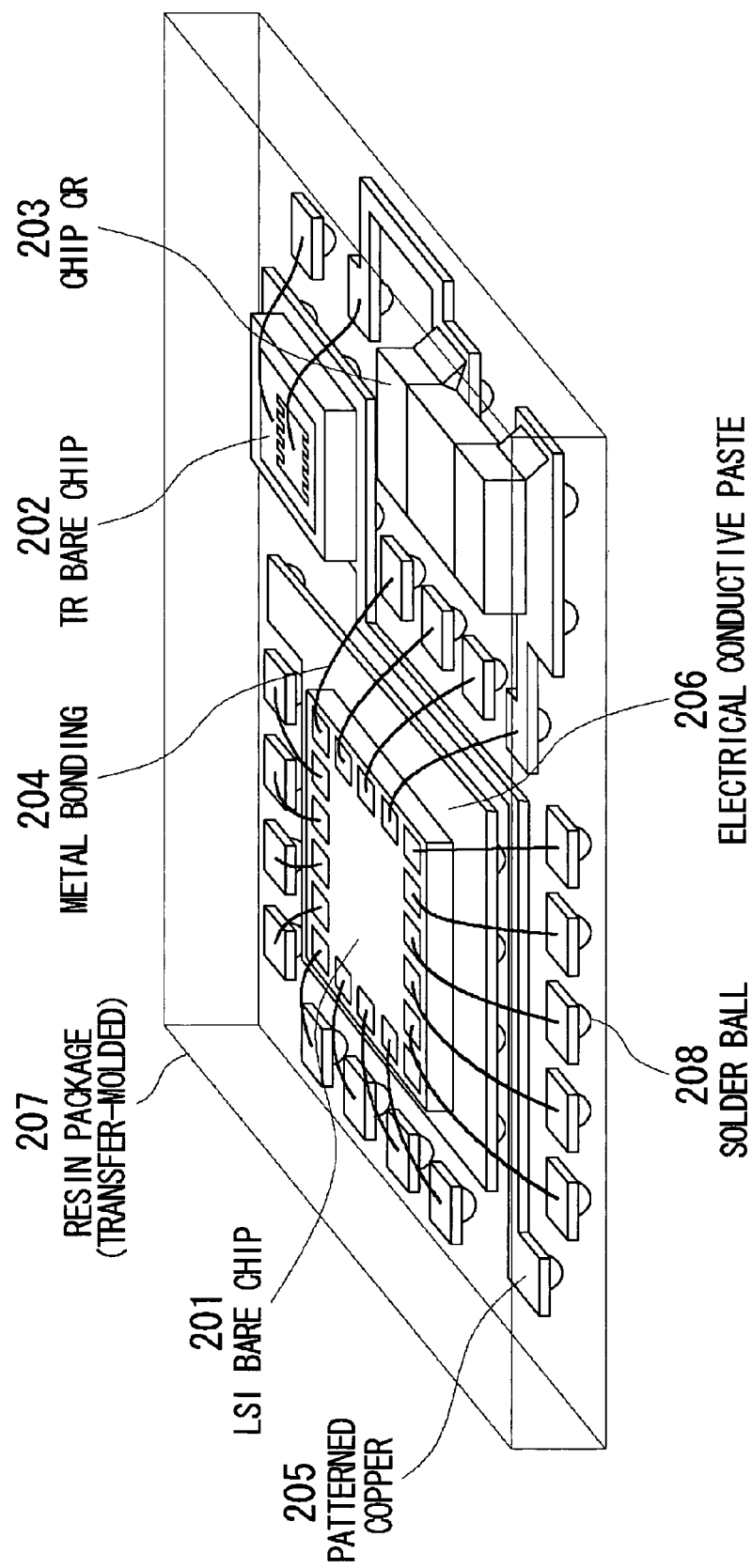
FIG. 2 is a perspective view of ISB™, for the use in describing the structure of the ISB™.

FIG. 2 is a schematic diagram showing an example of a structure of an ISB. Although this drawing exemplarily shows a single interconnect line layer for the benefit of understanding the whole structure of the ISB, the actual ISB comprises a laminate structure of a plurality of interconnect line layers. This ISB comprises a structure, comprising a LSI bare chip 201, a Tr bare chip 202 and a chip CR 203, which are coupled each other via an interconnect line of a patterned copper 205. The LSI bare chip 201 is electrically connected to feed through electrodes and/or interconnect lines via a metal line bonding 204. An electronically conducting paste 206 is disposed just under the LSI bare chip 201, through which ISB is mounted on the printed board. The whole ISB is sealed with a resin package 207 made of a resin such as epoxy resins.

This type of package provides the following benefits:

(i) the package achieves the miniaturization and the lower profile of the transistors, IC and LSI, because the mounting of devices can be achieved in the coreless configuration;

(ii) higher level of system-in package (SIP) can be provided, because an electronic circuit including wide variety of devices such as transistors, system LSI, and additionally chip-type condensers and resisters can be formed to pack them in one package;

(iii) time required for developing the system LSI can be reduced, because the existing semiconductor chips can be combined to be used;

(iv) better heat dissipation ability is obtainable, because there is not a core under the semiconductor bare chips;

(v) circuit interconnect lines having lower dielectric constant can be obtained because the circuit interconnect lines are made of copper material and have no core, so that improved characteristics in the high-speed data transfer and high-frequency circuit are provided;

(vi) preventing the generation of particle contaminations from the electrode materials, because the electrode is embedded within the package in this structure;

(vii) environmental load can be reduced, because the package size can be small and the amount of the waste materials per one package is about 1/10 of the expected waste generated from the typical 64-pin SQFP package;

(viii) new concept of the system structure can be achieved, from former printed circuit board for mounting parts to new circuit board comprising various functions; and (ix) engineers of the product manufacturer can design the pattern of the ISB without particular assistance, because the design of the pattern of the ISB is simple, just like as the design of the pattern of the printed circuit board is simple.

Figure 3A:
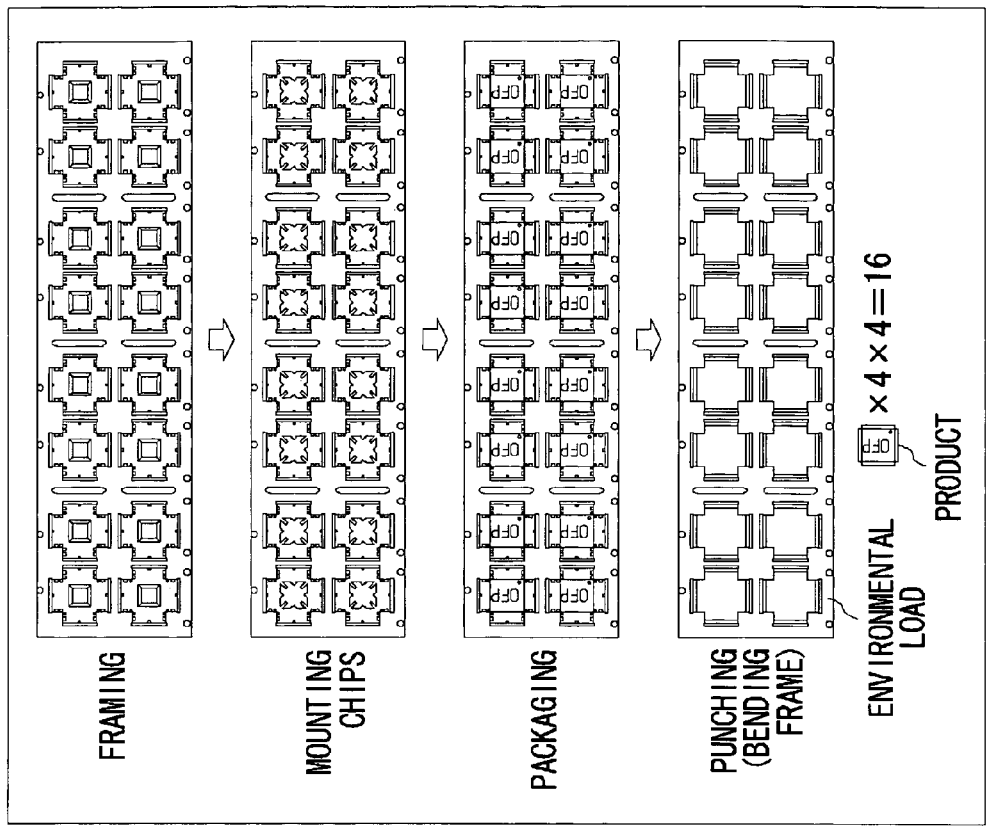
FIGS. 3A and 3B are plan views of the BGA and the ISB™, for the use in describing the manufacturing processes of the BGA and the ISB™.
Figure 3B:
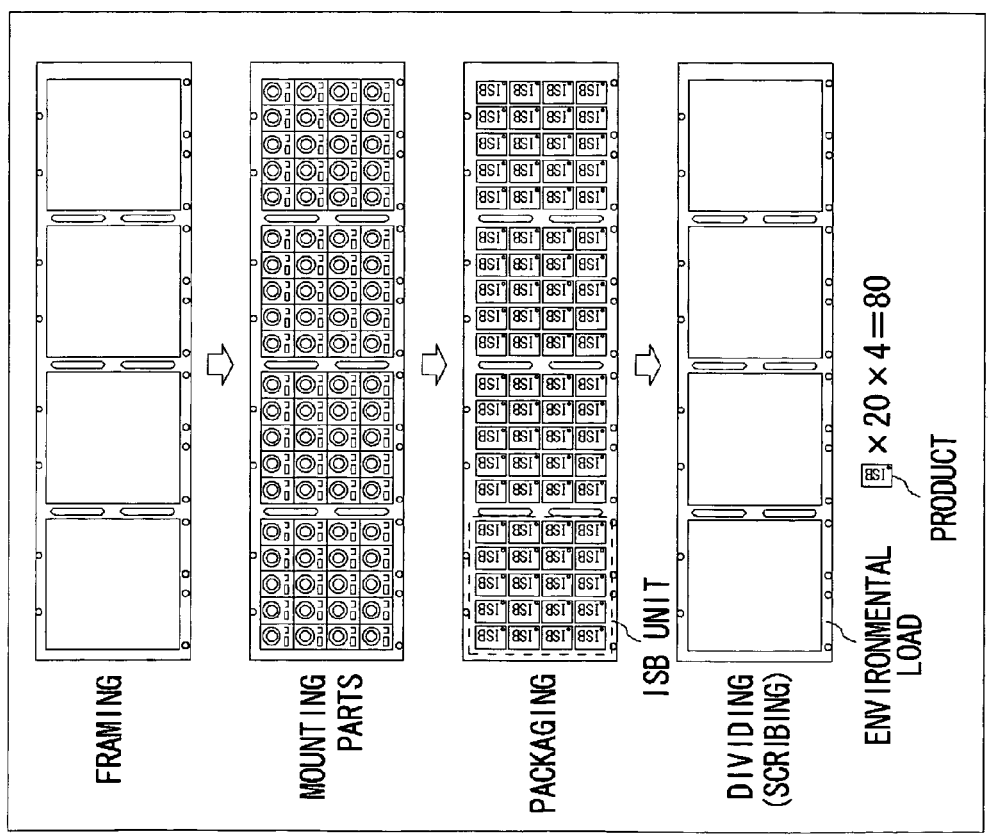

Next, the advantages in the manufacturing process for the ISB will be described below. FIG. 3A and FIG. 3B present comparisons between manufacturing process of the conventional CSP and that of the ISB according to the present invention. FIG. 3A shows a manufacturing process of the conventional CSP. First, frames are formed on a base substrate, and a chip is mounted in each of the frames of a device-forming region that is partitioned by the frames. Then, packages for each of the devices is formed by using a thermosetting resin, and thereafter punching processing is carried out for respective devices with a metal mold. In the punching processing of the final stage of the manufacturing process, the punching processing is designed that the mold resin and the base substrate are simultaneously cut off in one punching, and roughening of the cut surface thereof or the like becomes a problem. In addition, a large amount of waste materials are generated after the punching processing, and thus causing a problem of increasing the environmental load.

On the other hand, FIG. 3B is a diagram showing the manufacturing process for the ISB. First, frames are formed on a metal leaf, then each of patterned interconnect lines is formed on respective module-forming region, and circuit device such as LSI is mounted thereon. Subsequently, packaging processing is carried out for each of the modules, and then dicing processing is conducted along a scribing region to obtain a product. After completing the packaging processing and before the scribing processing, the underlying metal leaf is removed, and therefore only the resin layer is cut off during the dicing processing in the scribing processing. Therefore, the method can inhibit the roughening of the cut surface thereof, and can improve the accuracy of the dicing processing.

The critical technical issue for the system-in package such as ISB, which has no support substrate, is to preferably design the performances of the insulating resin layer that constitutes the interconnect line layer. However, the insulating resin layer of such package has considerably different structure and functions from that of the resin layer that constitutes the support substrate of the conventional CSP, and thus the consideration thereof with a different design concept from that for designing the conventional CSP is required. More details on this point will be described as follows.

Base substrate of the conventional CSP such as BGA or the like functions as an underlying substrate for forming semiconductor chips and their feedthrough electrodes thereon. Performances such as mechanical strength, dielectric properties and so on are required for the base substrate, and these performances are additional required properties thereof, in addition to the essential functions of the base substrate as described above. That is, the further design of the base substrate is conducted, in addition to essentially having a constitution, in which the base substrate intervenes between the semiconductor chips and the printed circuit board.

On the contrary, the module having no support substrate such as the module according to the present invention must be designed with a different view point from that for designing the BGA, even in the case of what type of resin should be selected for the insulating resin. The insulating resin layer according to the present invention functions as insulating layer between respective the interconnect lines that are patterned and embedded within the insulating resin layer. Therefore, different levels of the required properties, such as adhesiveness between the resin and the metal film constituting the patterned interconnect line, reduction of the parasitic capacitance in a region between metal films, the water absorption thereof or the like, is needed for the support substrate-free module than that for the conventional CSP support substrate. Further, since semiconductor chips such as bare chips are directly mounted on the surface of the insulating resin layer, severe level of reducing the water absorption is required.

On the other hand, applications used for high frequency conditions require the surface smoothness of a metal film constituting the patterned interconnect line. This is because the high frequency signal converges to a region in vicinity of the surface of the interconnect lines due to a skin effect, and thus a concavo-convex surface of the interconnect line may disturb the transfer of the signal. On the contrary, when the surface smoothness is increased, the adhesiveness thereof with the adjacent insulating resin layer tends to become poor. That is, the relationship of the high frequency performance and the adhesiveness between the interconnect line and the insulating resin layer is a trade off relationship. Therefore, it is a critical technical issue on how these problems should be improved.

Figure 4A:
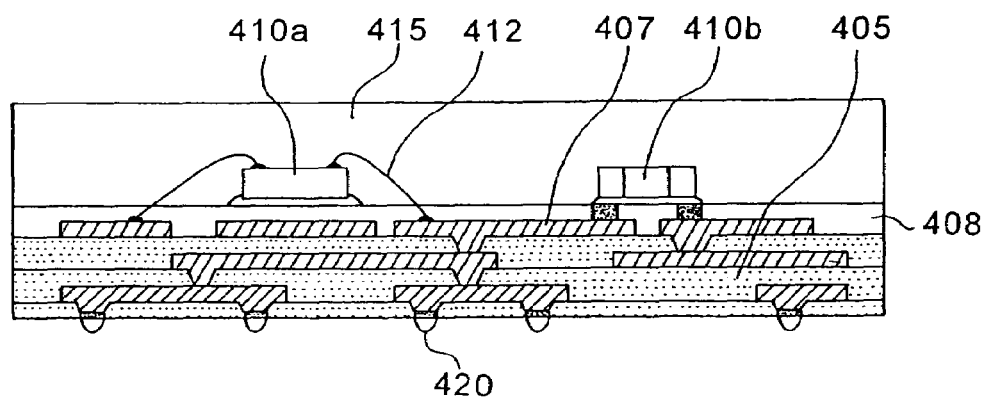
FIGS. 4A and 4B are cross sectional views of a semiconductor device of a preferred embodiment of the present invention, for the use in describing the structure of the semiconductor device.
Figure 4B:
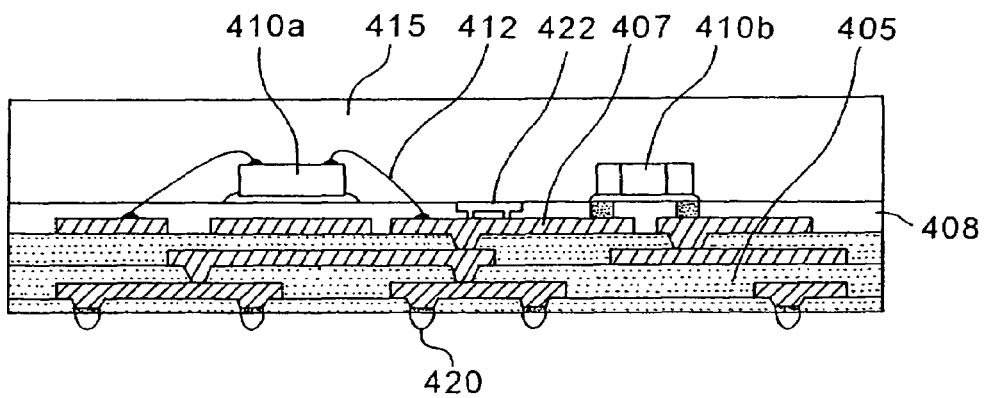

FIGS. 4A and 4B show examples of a semiconductor device according to the present invention.

Figure 13A:
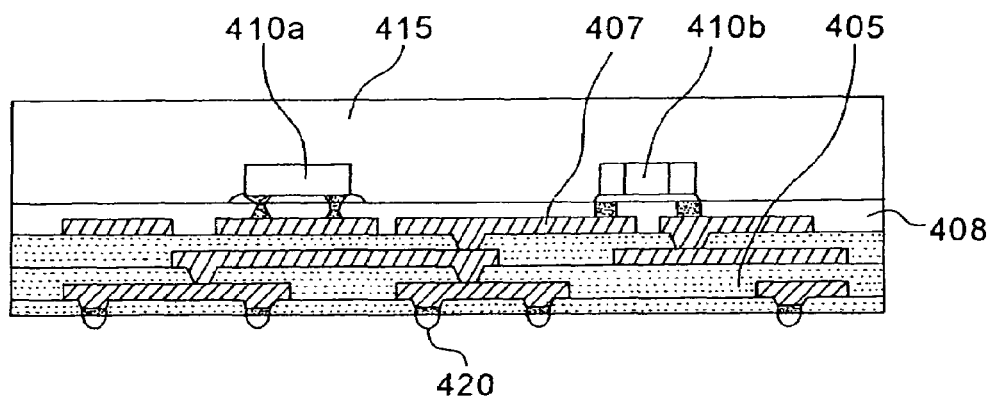
FIGS. 13A and 13B are cross sectional views of a semiconductor device of a preferred embodiment of the present invention, for the use in describing the structure of the semiconductor device having the semiconductor chips mounted thereto via flip-chip mounting.
Figure 13B:
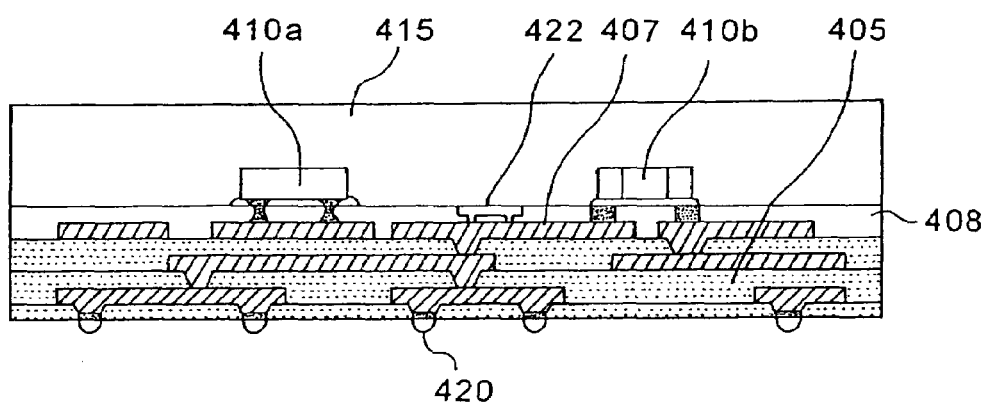

The semiconductor device shown in FIG. 4A includes a multi-layer interconnect line structure, which is formed by laminating a plurality of interconnect line layers formed of an interlayer insulating film 405 and an interconnect line 407, and circuit devices 410a and 410b formed on a surface thereof. Solder balls 420 are disposed on a backside of the multi-layer interconnect line structure. The circuit devices have a structure, in which 410a and 410b are sealed with a sealant resin 415. The semiconductor device shown in FIG. 4B further includes a pseudo-line 422 provided in addition to the structure shown in FIG. 4A. The addition of the pseudo-line 422 provides an improvement of the adhesiveness between the multi-layer interconnect line structure and the sealant resin 415. Although the wire bonding method is employed for the method of mounting the circuit device 410a shown in FIGS. 4A and 4B, the flip-chip mounting may be employed to dispose the circuit device 410a thereon to be a facedown position, as shown in FIGS. 13A and 13B Such semiconductor device has the structure, in which the interlayer insulating film 405 is intervened between each of the laterally adjacent interconnect lines 407 or between each of the vertically adjacent interconnect lines 407. Thus, it is critical to be compatible of i) providing improved adhesiveness between the interconnect line 407 and the interlayer insulating film 405 with ii) reducing the parasitic capacitance generated between each of the laterally adjacent interconnect lines 407 or between each of the vertically adjacent interconnect lines 407. Here, in view of improving the high frequency performance, it is desired to have smooth surface of the interconnect line 407, and more specifically to provide Ra of equal to or less than 1 μm, for example. In such case, it further becomes difficult to improve the adhesiveness between the interconnect line 405 and the interlayer insulating film 407.

In addition, since the semiconductor device does not include a support substrate, moisture entering from the backside of the multi-layer interconnect line structure is structurally apt to reach the circuit device 410a and so on. Since the circuit device 410a is a bare chip, which is not sealed with a sealant resin, performances thereof will considerably decrease due to the entering of the moisture. As such, it is a critical technical issue to select the preferable materials for the interlayer insulating film 405 to sufficiently inhibit the penetration of the moisture.

In order to solve these problems, the module shown in FIG. 4A may comprise the interlayer insulating film 405 including a resin material that satisfies the following conditions. That is, the resin having a relative dielectric constant within a range from 1.0 to 3.7, and a dielectric loss tangent within a range from 0.0001 to 0.02, at a frequency within the frequency range of 1 MHz to 1 GHz, is employed. The relative dielectric constant of the resin material may preferably be equal to or less than 3.0. Having this range of the relative dielectric constant, the parasitic capacitance between the interconnect lines can be reduced to a level that does not cause a problem in the practical operation, when the size of the module is reduced. The dielectric loss tangent may preferably be not higher than 0.003. Having this range of the dielectric loss tangent, the signal loss can be further reduced.

The exemplary material for forming the interlayer insulating film 405 may be melamine derivatives such as BT resin and so on, liquid crystal polymers, epoxy resins, PPE resins, polyimide resins, fluorocarbon resins, phenolic resins and thermosetting resins such as polyamide bismaleimide or the like. Among these, liquid crystal polymers, epoxy resins or melamine derivatives such as BT resin and so on, which have better high frequency performance, may preferably be employed. Fillers and/or additives may optionally be added with these resins.

The exemplary epoxy resins may include bisphenol-A resins, bisphenol-F resins, bisphenol-S resins, phenol novolac epoxy resins, cresol-novolac epoxy resins, tris phenol methane epoxy resins, alicyclic epoxy resins or the like.

The exemplary melamine derivatives may include melamine, melamine cyanurate, methylol melamine, (iso) cyanuric acid, melam, melem, melon, succinoguanamine, melamine sulfonate, acetoguanamine sulfonate, melam sulfonate, guanyl melamine sulfonate, melamine resins, BT resin, cyanuric acid, isocyanuric acid, isocyanuric acid derivatives, melamine derivatives such as melamine isocyanurate, benzoguanamine or acetoguanamine, guanidine compounds and so on.

The exemplary liquid crystal polymers may include aromatic liquid crystal polyesters, polyimides, polyester amides or resin compositions including thereof. Among these, liquid crystal polyesters or resin compositions including liquid crystal polyesters, which have well-balanced performances of the heat resistance, the processibility and the moisture absorption, may preferably be employed.

The exemplary liquid crystal polyesters may include, for example, (1) a compound obtainable by a chemical reaction of an aromatic dicarboxylic acid, an aromatic diol and an aromatic hydroxycarboxylic acid; (2) a compound obtainable by a chemical reaction of a combination of different aromatic hydroxycarboxylic acids; (3) a compound obtainable by a chemical reaction of an aromatic dicarboxylic acid and, an aromatic diol; (4) a compound obtainable by a chemical reaction of a polyester such as polyethylene terephthalate and an aromatic hydroxycarboxylic acid, or the like. Alternatively, the aromatic dicarboxylic acid, the aromatic diol and the aromatic hydroxycarboxylic acid may be substituted with ester derivatives thereof. In addition, the aromatic dicarboxylic acid, the aromatic diol and the aromatic hydroxycarboxylic acid may also be substituted with compounds, in which benzene ring of these aromatic compounds is substituted with halogen atom, alkyl group, aryl group or the like.

The exemplary structural repeating unit (SRU) of the liquid crystal polyesters may include: a structural repeating unit derived by aromatic dicarboxylic acid (formula (i) shown below); a structural repeating unit derived by aromatic diol (formula (ii) shown below); and a structural repeating unit derived by aromatic hydroxycarboxylic acid (formula (iii) shown below).

$$-CO-A_1-CO- \qquad (i)$$

(where $A_1$ is divalent coupling group having aromatic ring), $$-O-A_2-O- \qquad (ii)$$

(where $A_2$ is divalent coupling group having aromatic ring), and $$-CO-A_3-O- \qquad (iii)$$

(where $A_3$ is divalent coupling group having aromatic ring).

Furthermore, although the interlayer insulating film 405 may be constituted by a material that substantially expands or shrinks by treating heat, the interlayer insulating film 405 is preferably constituted by a material having the coefficient of thermal expansion within a range from −5 to 5 ppm/degree centigrade. By using the material having the coefficient of thermal expansion (ppm/degree centigrade) of the above range to manufacture a semiconductor device, influence of variety of heat hysteresises that are burden to the semiconductor device during the manufacturing process thereof can be reduced. Thus, displacement of alignment of layers composing the semiconductor device is reduced. As a result, the semiconductor device having improved high frequency performance can be obtained.

Next, a preferred embodiment of the present invention will be described in reference to a method for manufacturing a support substrate-free semiconductor device, referring the FIGS. 5A, 5B, 5C, 6A, 6B and 7.

Figure 5A:
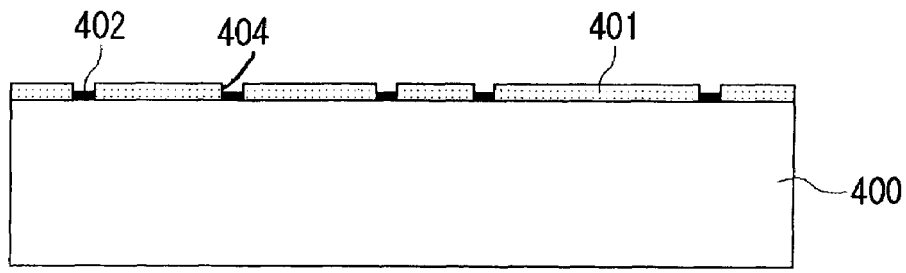
FIGS. 5A, 5B and 5C are cross sectional views of a semiconductor device of a preferred embodiment of the present invention, for the use in describing the manufacturing process of the semiconductor device.

As shown in FIG. 5A, electrical conductive films 402 are selectively formed on a selected surface of a metal foil 400. More specifically, the metal foil 400 is coated with a photo resist 401, and thereafter the electrical conductive films 402 are formed on exposed portions of the surface of the metal foil 400 via electrolytic plating. The film thickness of the electrical conductive film 402 is, for example, about 1 to 10 μm. Since the electrical conductive film 402 will eventually be a back surface electrode of the semiconductor device, it is preferable to form the electrical conductive film with gold or silver, which has better adhesiveness with blazing materials such as solder or the like. The base material for the metal foil 400 may preferably be Cu, Al, or an alloy of metals such as Fe—Ni or the like, since these metals/alloys have better adhesiveness with blazing materials and better plating-ability. Although the thickness of the metal foil 400 in this embodiment is 70 μm, the thickness of the metal foil is not particularly limited thereto. The thickness of the metal foil is commonly about 10 μm to 300 μm.

Subsequently, as shown in FIG. 5A, a first layer of a patterned interconnect line is formed on the metal foil 400. First, the metal foil 400 is chemically polished to conduct cleaning and roughening of the surface thereof. Then, a thermosetting resin is applied on the metal foil 400 cover the entire surface of the electrical conductive films 402, and the thermosetting resin is thermally cured to obtain resin films having flat surfaces. Subsequently, via holes 404 having a diameter of about 100 μm are formed through the resin film to expose the electrical conductive film 402. Although the methods for forming the via holes 404 in this embodiment is a processing utilizing carbon dioxide laser, other methods such as mechanical processing, chemical etching with chemical solutions, dry etching with plasma or the like may be employed.

Thereafter, excimer laser is irradiated to remove the etching residues, and subsequently, a copper-plated layer is formed on the entire surface thereof to fill the via holes 404 therewith. The process for forming the copper-plated layer is carried out by the following process steps in order to avoid breaking the copper-plated layer at the steps of the edge of the via holes 404: first, electroless copper plating is conducted to form a thin copper layer having a thickness of about 0.5 μm on the entire surface thereof, and then the electrolytic copper plating is conducted to form the copper layer having a total thickness of about 20 μm. In general, palladium is often used for catalyst for the electroless copper plating, and the method for adhering the catalyst for the electroless copper plating onto a flexible insulating base is conducted by the following steps: palladium is dispersed in the water solution as palladium complex, and the flexible base is immersed into the water solution to adhere palladium complex on the surface of the flexible base, and then palladium complex is deoxidized to create metal palladium, and thus nucleuses for initializing the plating are formed on the surface of the flexible insulating base. Typically, an object to be plated is cleaned with alcohol or water to remove the oil content adhered onto the surface, in order to make a preparation for this operation.

When the copper-plated layer is formed, the conditions for the formation thereof may be controlled so as to provide a desired level of the surface roughness or surface morphology, and further improve the adhesiveness thereof with the interlayer insulating film that will be formed later. For example, when the electroless plating is conducted, an additive agent may be added to the plating solution, and thereafter the electrolytic plating is conducted with pulsed electric current at a predetermined condition, and then the surface thereof is treated with a chemical solution to form a concavo-convex surface of the fine copper particles on the smooth surface thereof. This provides improved adhesiveness of the surface with the interlayer insulating film. In order to preferably form the concavo-convex surface of the fine copper particles, it is preferable to form the reduced grain size of the copper particles and create the random orientation of the crystalline axis of the copper grain during the electroless plating. The concavity and convexity of the copper-plated layer surface formed by the similar method to this embodiment is measured, and the result is about 0.8 μm.

Figure 5B:
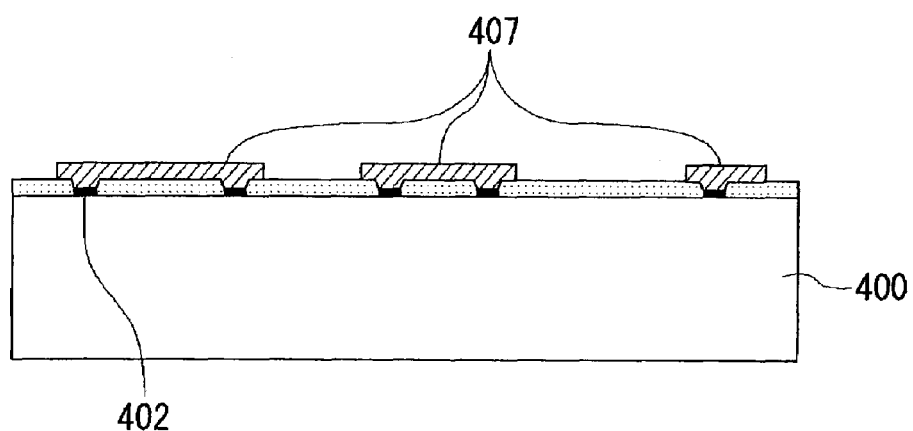

Thereafter, as shown in FIG. 5B, the copper-plated layer may be etched via a mask of the photo resist to form the interconnect line 407 of copper. For example, a chemical etchant solution may be sprayed to the exposed portion thereof that is not covered by the resist to etch the unwanted portions of the copper foil off, thereby forming the patterned interconnect lines. Available etching resist may be etching resist materials that can be utilized to the ordinary printed board, and such resist may be formed by: conducting a silk-screen printmaking process with a resist ink; or laminating a photosensitive dry film for the etching resist on the copper foil and further applying the photo mask thereon, which is capable of transmitting lights with a transmitting shape corresponding to shape of the electrical conductive interconnect lines, and thereafter exposing thereof with ultraviolet light, and then removing the unexposed portions with a developing solution. The available chemical etchant solution may be chemical etchant solutions for the use of the ordinary printed circuit board, such as a solution of copper chloride and hydrochloric acid, a ferric chloride solution, a solution of sulfuric acid and hydrogen peroxide, ammonium persulfate solution or the like.

Figure 5C:
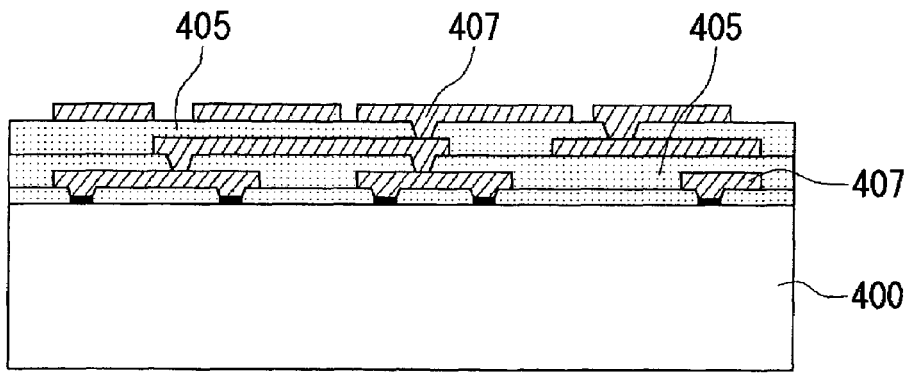

Similar procedures of forming the interlayer insulating film 405, forming the via holes, forming the copper-plated layer and patterning the copper-plated layer are repeated to form a multi-layer interconnect line structure as shown in FIG. 5C. That is, the multi-layer interconnect line structure comprising the laminated structure of the interconnect line layers, which comprises the interconnect lines 407 and the interlayer insulating films 405, is formed.

The material for the interlayer insulating film 405 employed in this embodiment is liquid crystal polymer without filler. This liquid crystal polymer used in this embodiment has a relative dielectric constant within a range from 1.0 to 3.7, a dielectric loss tangent within a range from 0.0001 to 0.02 and a water absorption of equal to or less than 0.1%. Although liquid crystal polymer is used in this embodiment, other materials such as epoxy resins, BT resin or the like may be used.

Figure 6A:
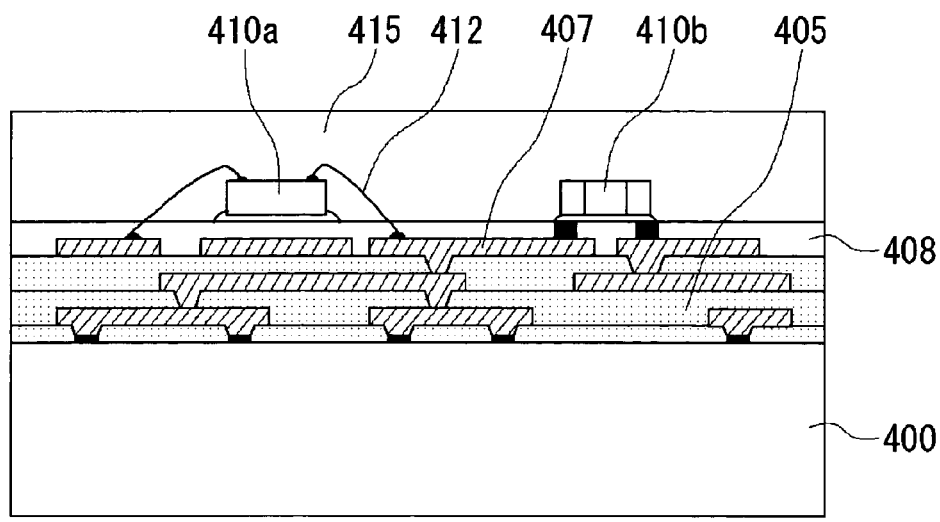
FIGS. 6A and 6B are cross sectional views of a semiconductor device of a preferred embodiment of the present invention, for the use in describing the manufacturing process of the semiconductor device.

Subsequently, as shown in FIG. 6A, circuit devices 410a and 410b are mounted. First, a solder resist layer 408 is formed on the surface of the multi-layer patterned interconnect lines. The exemplary materials for the solder resist layer 408 may be: resins such as epoxy resins, acrylic resins, urethane resins, polyimide resins or the like and mixtures thereof; or above-mentioned resins having inorganic fillers mixed therein, the inorganic fillers including carbon black, alumina, aluminum nitride, boron nitride, tin oxide, iron oxide, copper oxide, talc, mica, kaolinite, calcium carbonate, silica, titanium oxide or the like. Epoxy resins having filler therein is employed in this embodiment.

Then, the circuit devices 410a and 410b are mounted on the surface of the solder resist layer 408, and the circuit device 410a is electro-conductively coupled to the interconnect 407 via a gold wire 412, and thereafter these are molded with a insulating resin 415. The circuit devices 410a and 410b may be a semiconductor device such as transistor, diode, IC chip or the like, or a passive device such as chip condenser, chip resistor or the like. Further, facedown-type semiconductor devices such as CSP, BGA or the like may be mounted thereon. In the structure shown in FIG. 6A, the circuit device 410a is a bare transistor chip, and the circuit device 410b is a chip condenser. These devices are bonded to the solder resist layer 408 with a blazing material such as solder or the like. The circuit device 410b is coupled to the interconnect line 407 via the via hole. Alternatively, the devices may be bonded thereto via adhesives or the like, without using solder. In such case, a structure without having the solder resist layer 408 may also be employed. The molding process for each of the circuit devices are simultaneously carried out for a plurality of modules provided on the metal foil 400 by using a metal mold. Such process may be conducted by transfer molding, injection molding, potting process or dipping process. The available resin materials may be: thermosetting resins such as epoxy resins for transfer molding or potting process, and thermoplastics such as polyimide resins, polyphenylenesulfide or the like for injection molding.

Figure 6B:
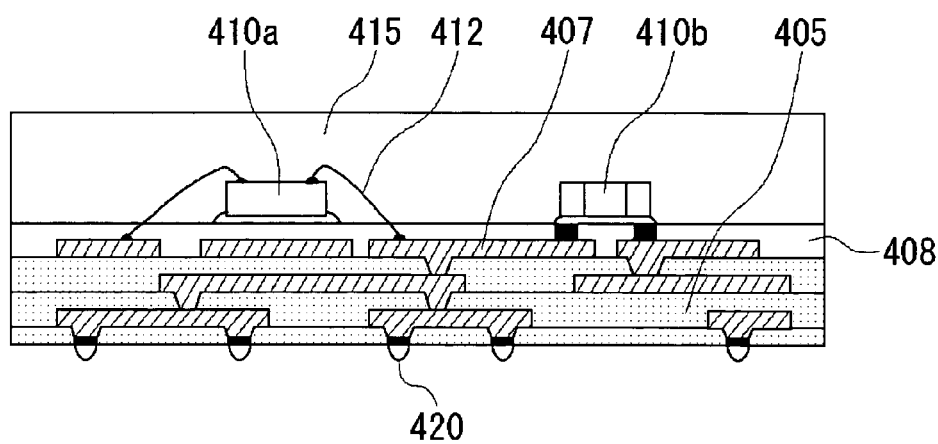

Thereafter, as shown in FIG. 6B, the metal foil 400 is removed from the multi-layer interconnect line structure, and solder balls 420 are formed on the backside thereof. The removal of the metal foil 400 may be carried out by polishing, grinding, etching, metal evaporation with laser or the like. The method employed in the present embodiments is as follows. The entire surface of the metal foil 400 is polished with a polishing apparatus, or grinded with a grinding apparatus, by about 50 μm, and the residual metal foil 400 is chemically etched off via the chemical wet etching. Alternatively, whole metal foil 400 may be removed by the chemical wet etching. Having such processing, the structure, in which the backside of the first interconnect line 407 are exposed on the surface opposite to the surface having the circuit devices thereon, is provided. This provides the flat backside surface of the module obtained in the present embodiment, and thus an advantageous effect related to the manufacturing process is obtained, in which the module can horizontally move by itself with a surface tension of the solder or the like during the mounting process of the semiconductor device, thereby providing the self-alignment without difficulty. Subsequently, the exposed electrical conductive film 402 is coated with an electrical conductive material such as solder to form solder balls 420, thereby completing the semiconductor device.

The metal foil 400 functions as the support substrate, until the removal process for the metal foil 400 is conducted. The metal foil 400 may also be utilized as the electrode, in the electrolytic plating process for forming the interconnect lines 407. Also, the metal foil 400 improves the operate ability of transferring thereof to the metal mold and mounting thereof on the metal mold, when the molding process is conducted with the sealant resin 415.

Figure 7:
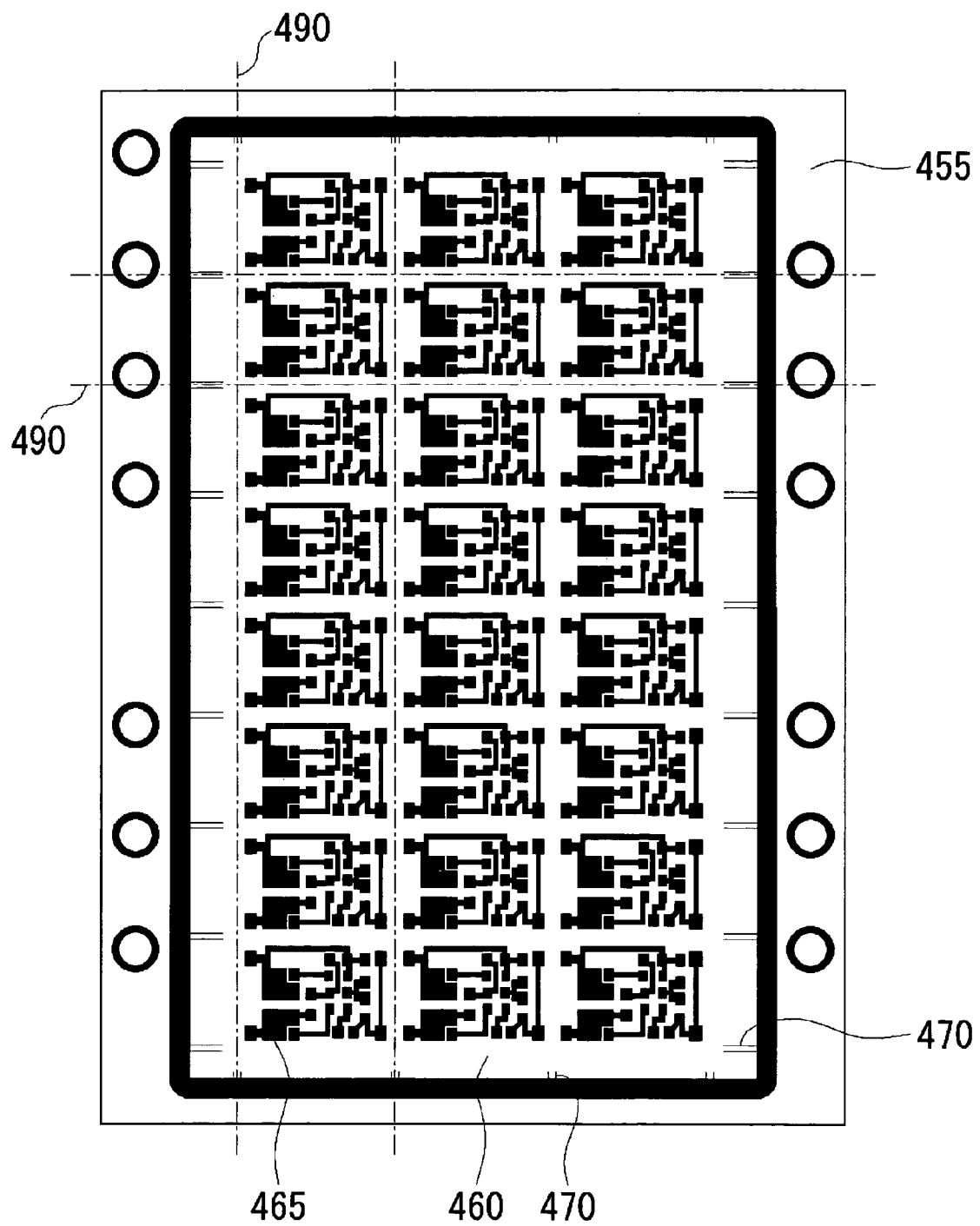
FIG. 7 is a plan view of a semiconductor device of a preferred embodiment of the present invention, for the use in describing the manufacturing process of the semiconductor device.

Then, a sealant resin 415 is separated by respective semiconductor device via dicing process. FIG. 7 is a diagram for describing the method of dicing. A plurality of the semiconductor device-forming regions are disposed on a insulating resin layer 455 to form a matrix shape. The portions of the insulating resin layer 455 having no patterned interconnect 465 formed thereon include exposed insulating resin 460. Since the dicing process is conducted along the dicing line 490, only the insulating resin is cut off and thus the roughening of the cut surface and/or the wear of the blade, which are caused by the cutoff of the metal foil and/or the cutoff of the mold resin, are inhibited. It should be noted that since aligning marks 470 are employed in the present embodiment, positions of the dicing line can be rapidly and precisely found. In the conventional CSP such as BGA or the like, the method of punching the modules out by using a metal mold is employed. On the other hand, the present embodiment employs cutting the insulating resin off by the dicing process to obtain the modules, and therefore considerable advantages related to the manufacturing process can be obtained.

The support substrate-free semiconductor devices can be manufactured by using the above-mentioned processes. The semiconductor devices may be manufactured by other method than that described in the above embodiment. For example, a method of forming modules on both sides of the metal foil 400 may be employed.

EXAMPLES

Example 1

The high frequency performance of the insulating resin used for the semiconductor device was evaluated in the first example. Samples for the evaluation were manufactured by disposing an underlying line, disposing an interlayer insulating film thereon, disposing an upper line thereon, and providing an interlayer coupling plug that couples the underlying line to the upper line to form a structure. Two types of samples were prepared: one comprises a sealant resin layer disposed directly thereon without intervening a solder resist layer; and the other comprises a sealant resin layer disposed on the surface of the upper line via a solder resist layer. The interconnect lines were formed of copper-plated film, and the dimension thereof for both the underlying layer and the upper layer was: a width of 90 μm and a length of 10 mm. The surface roughness Ra of the copper film was 0.8 μm.

The following sample 1 and sample 2 comprising different resin materials for the interlayer insulating film were manufactured.

Sample 1: wholly aromatic polyester liquid crystal polymer (commercially available under the trade name of "Vecstar" by KURARAY, Osaka Japan); and Sample 2: glass epoxy (FR-4).

Figure 8:
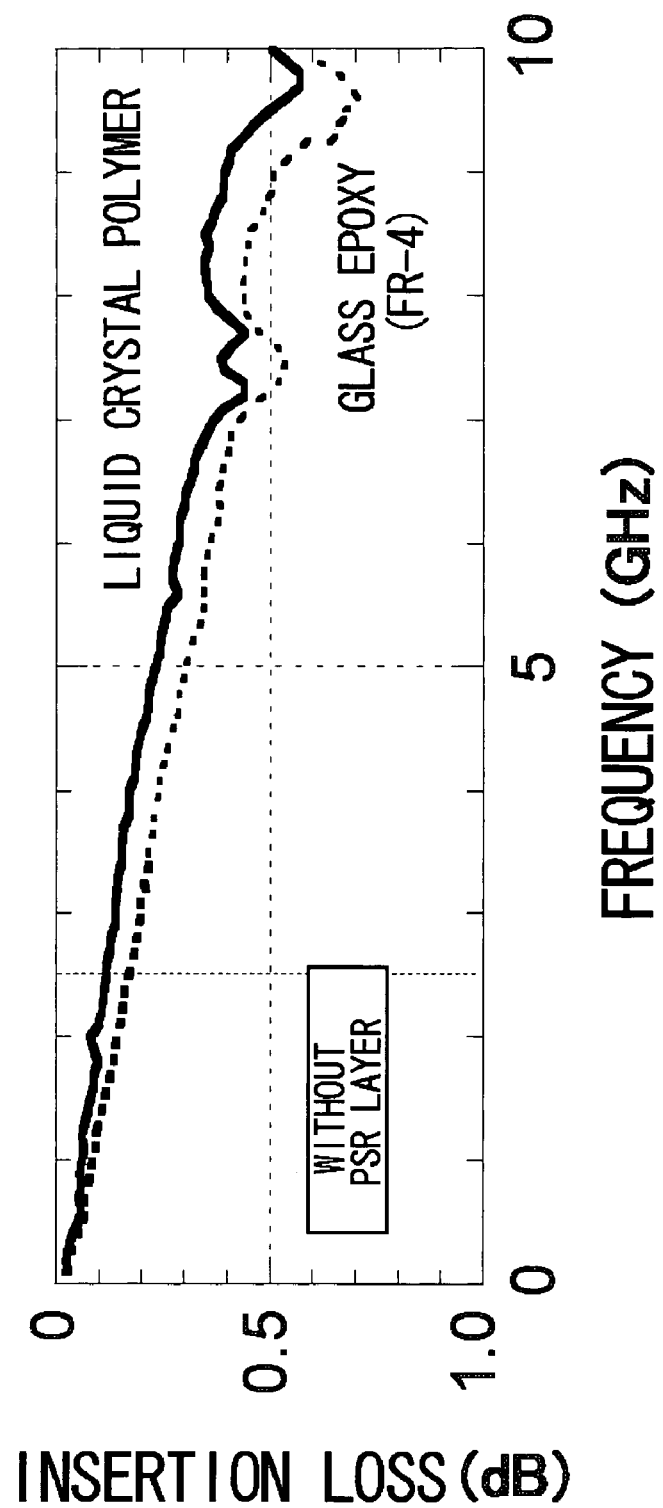
FIG. 8 is a graph showing results of the evaluation of the semiconductor device having no solder resist layer manufactured in the example of the present invention.
Figure 9:
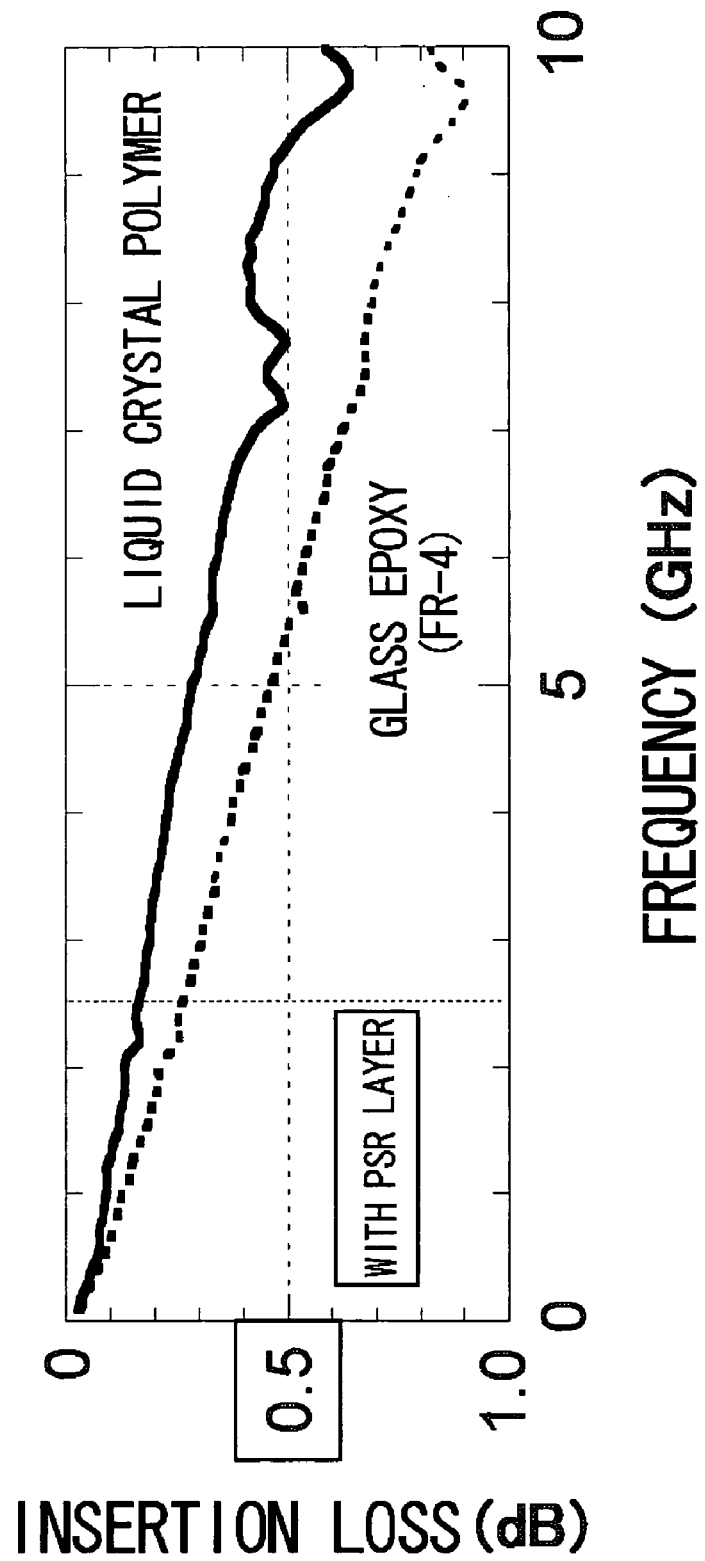
FIG. 9 is a graph showing results of the evaluation of the semiconductor device having the solder resist layer manufactured in the example of the present invention.

FIG. 8 shows the results of the evaluation for the interconnect line structure having no solder resist layer. FIG. 9 shows the results of the evaluation for the interconnect line structure having the solder resist layer. In both cases, the interconnect line structure employing liquid crystal polymer presents lower loss. For example, for the structure having no solder resist layer, the sample 1 exhibits a better performance in the insertion loss of not higher than 0.2 dB/cm (at 5 GHz)

Example 2

Semiconductor devices having dual interconnect line structure were manufactured in a similar process as shown in FIGS. 5A, 5B, 5C, 6A, 6B and 7. LSI chips, CR chips, TR chips or the like were disposed on the upper surface of the interconnect line structure. Copper was employed for the material of the interconnect line. The surface roughness Ra of the copper film formed by the same process as employed in this example was 0.8 μm. The materials used for the interlayer insulating film were shown in Table-1, and the three types of samples (sample NO. 1 to 3) were prepared.

TABLE 1

| | No. | | |
|---|---|---|---|
| | 1 | 2 | 3 |
| resin type | liquid crystal polymer | epoxy resin | BT resin |
| dielectric constant | 2.85 (1 GHz) | 3.6, 3.7 (1 MHz) | 3.4 (1 GHz) |
| dielectric loss tangent | 0.0025 (1 GHz) | 0.003, 0.006 (1 MHz) | 0.003 (1 GHz) |
| glass transition temperature | 205 | 230 | 220 |
| copper foil peeling test (18 or 35 μm) kN/m | 0.9 | 1.4 | 1.5 |
| water absorption (%) | 0.04 | 0.1 | |
| manufacturer | KURARAY | SUMITOMO BAKELITE | MITSUBISHI GAS CHEMICAL |
| product name | Vecstar | ELC-4778GS | HL950K-SK |

Figure 10:
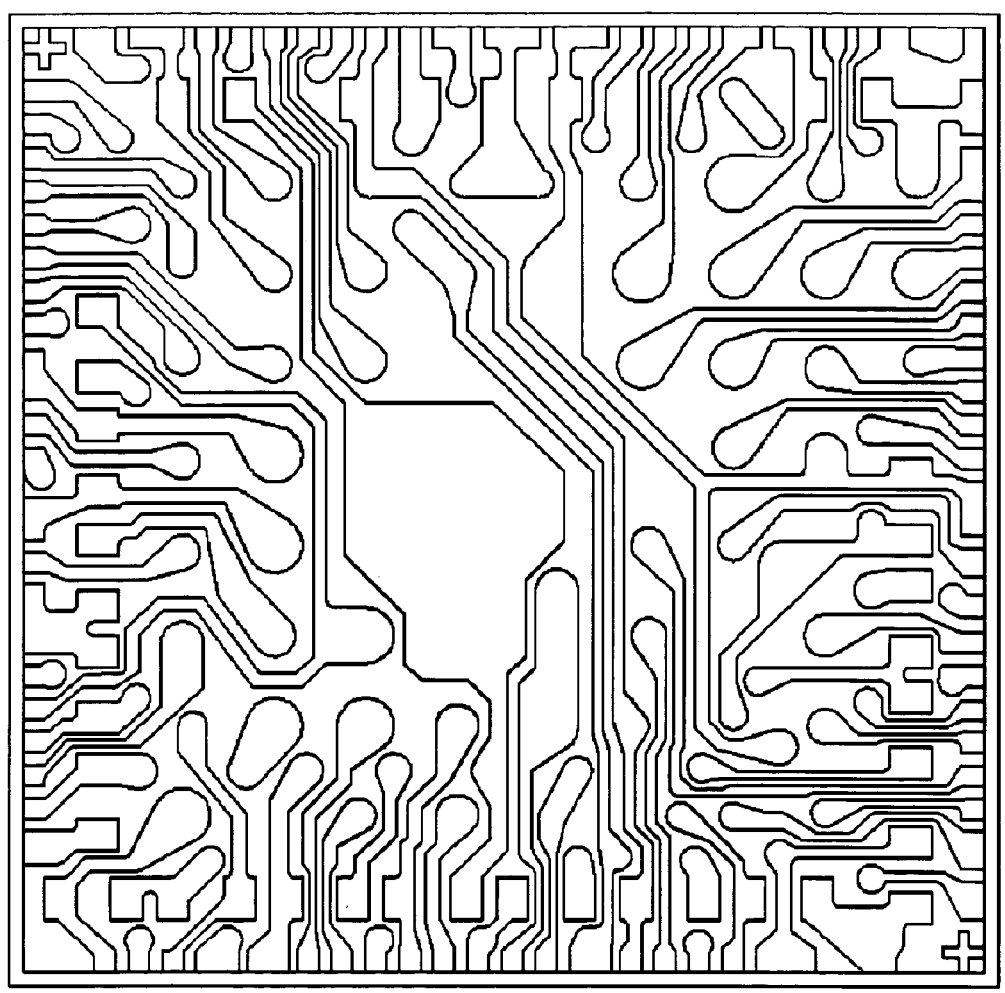
FIG. 10 is a plan view of the interconnect line structure of the first layer of the multi-layered structure of the semiconductor device manufactured in the example according to the present invention.
Figure 11:
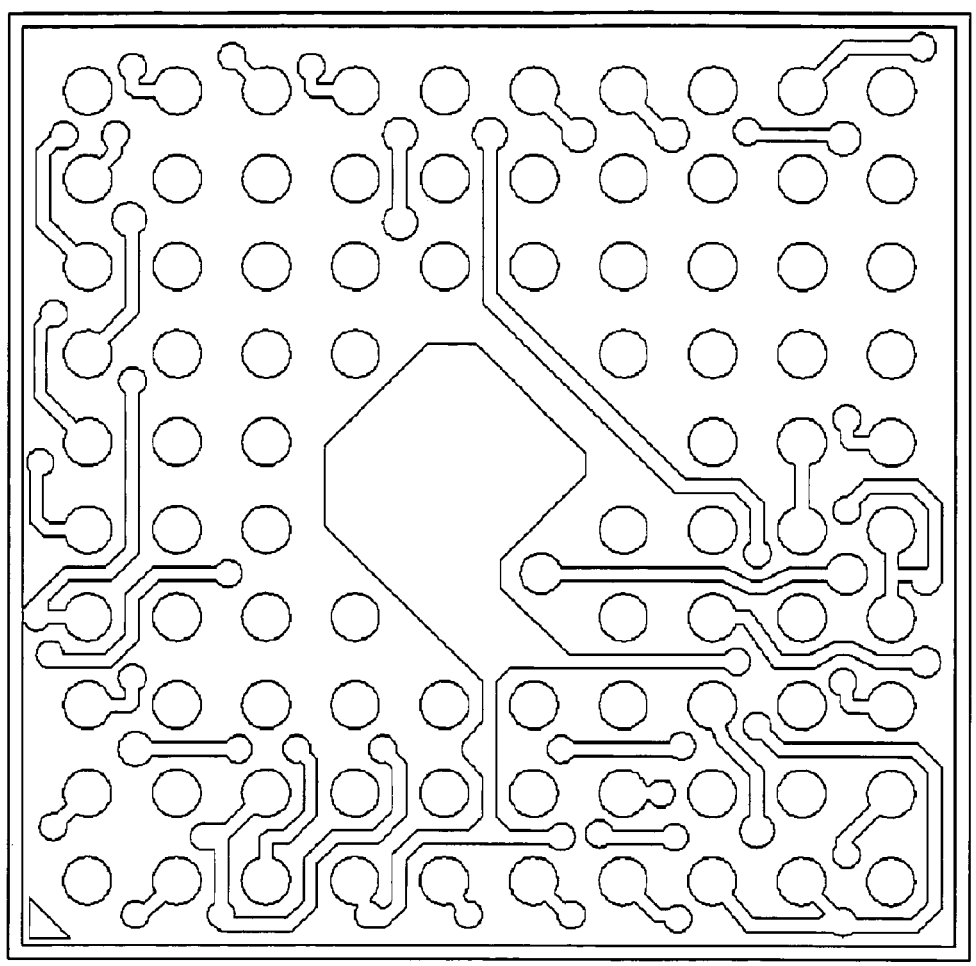
FIG. 11 is a plan view of the interconnect line structure of the second layer of the multi-layered structure of the semiconductor device manufactured in the example according to the present invention.
Figure 12:
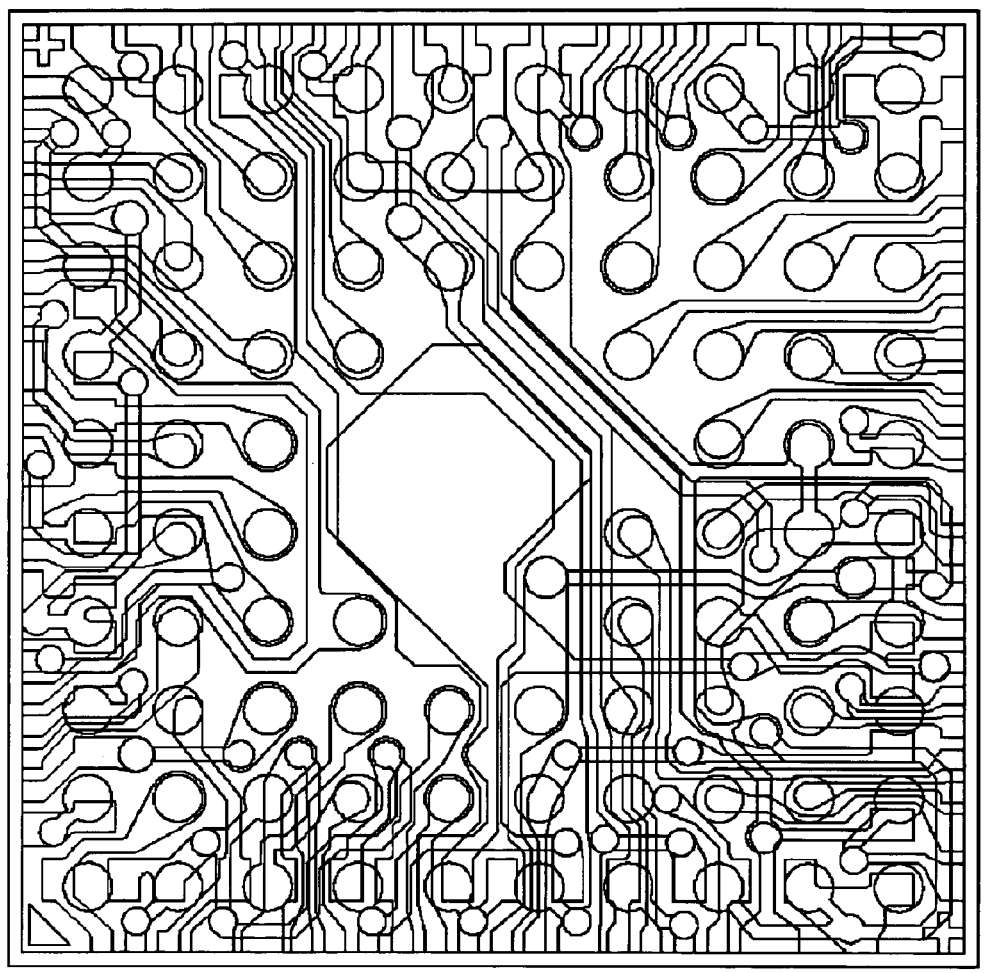
FIG. 12 is an overlapping view of the interconnect line structure of the first layer and the second layer of the multi-layered structure of the semiconductor device manufactured in the example according to the present invention.

The interconnect line structures of the samples are shown in FIGS. 10 to 12. FIG. 10 shows the interconnect lines of the first layer, FIG. 11 shows the interconnect lines of the second layer and FIG. 12 shows the overlapping view thereof for the laminated structure thereof. In these figures, circles correspond to the portions in which interlayer coupling plugs were formed. The obtained samples were evaluated and confirmed that these samples had improved high frequency performance.

Example 3

The high frequency performance of the insulating resin used for the semiconductor device, in which wholly aromatic polyester liquid crystal polymers described below having different coefficient of thermal expansion are used as the interlayer insulating film insulating, was evaluated in this example. Samples for the evaluation were manufactured by disposing an underlying line, disposing an interlayer insulating film thereon, disposing an upper line thereon, and providing an interlayer coupling plug that couples the underlying line to the upper line to form a structure.

Sample 3: wholly aromatic polyester liquid crystal polymer, commercially available under the trade name of "Vecstar FA" by KURARAY, Osaka Japan, coefficient of thermal expansion: −5 (ppm/degree centigrade);

Sample 4: wholly aromatic polyester liquid crystal polymer, commercially available under the trade name of "Vecstar OC" by KURARAY, Osaka Japan, coefficient of thermal expansion: 5 (ppm/degree centigrade); and Sample 5: wholly aromatic polyester liquid crystal polymer, commercially available under the trade name of "Vecstar CTS" by KURARAY, Osaka Japan, coefficient of thermal expansion: 18 (ppm/degree centigrade). Here, the coefficient of thermal expansion were measured by TMA (Thermo Mechanical Analysis) at 30 degree centigrade to 50 degree centigrade.

All of these samples had good high frequency performance, and especially, samples 3 and 4 had improved high frequency performance.

As described above, the present invention employs the specific insulating resin layer, and thus the semiconductor device having considerably improved performances such as high frequency performance is obtainable.

What is claimed is:

1. A semiconductor device, comprising:
   an insulating resin layer; and
   a semiconductor chip mounted on said insulating layer;
   wherein said insulating resin layer includes a patterned interconnect line embedded therein,
   wherein said insulating resin layer has a relative dielectric constant within a range from 1.0 to 3.7, and a dielectric loss tangent within a range from 0.0001 to 0.02, and
   wherein surface roughness Ra of said patterned interconnect line is equal to or less than 1 μm.

2. The semiconductor device according to claim 1, wherein water absorption of said insulating resin layer is equal to or less than 0.1%.

3. The semiconductor device according to claim 1, wherein said insulating resin layer includes a patterned interconnect line having a multi-layer structure embedded therein.

4. The semiconductor device according to claim 1, wherein said insulating resin layer contains liquid crystal polymer, epoxy resin or BT resin.

5. The semiconductor device according to claim 1, wherein said semiconductor chip is flip-chip mounted on said insulating layer.

6. A thin plate interconnect line member having a semiconductor chip-mounting surface and an interconnect line substrate-coupling surface opposite to said chip-mounting surface, comprising:
   an insulating resin layer; and
   a patterned interconnect line being embedded within said insulating resin layer,
   wherein at least a part of said patterned interconnect line is exposed on said interconnect line substrate-coupling surface,
   wherein said insulating resin layer has a relative dielectric constant within a range from 1.0 to 3.7, and a dielectric loss tangent within a range from 0.0001 to 0.02, and
   wherein the surface roughness Ra of said patterned interconnect line is equal to or less than 1 μm.

7. The thin plate interconnect line member according to claim 6, wherein water absorption of said insulating resin layer is equal to or less than 0.1%.

8. The thin plate interconnect line member according to claim 6, wherein a patterned interconnect line having a multi-layer structure is embedded in said insulating resin layer.

9. The thin plate interconnect line member according to claim 6, wherein said insulating resin layer contains liquid crystal polymer, epoxy resin or BT resin.

* * * * *